United States Patent
Yoon et al.

(10) Patent No.: US 8,004,880 B2
(45) Date of Patent: Aug. 23, 2011

(54) READ DISTURB REDUCTION CIRCUIT FOR SPIN TRANSFER TORQUE MAGNETORESISTIVE RANDOM ACCESS MEMORY

(75) Inventors: Sei Seung Yoon, San Diego, CA (US); Seung H Kang, San Diego, CA (US); Medi Hamidi Sani, Rancho Santa Fe, CA (US)

(73) Assignee: QUALCOMM Incorporated, San Diego, CA (US)

( * ) Notice: Subject to any disclaimer, the term of this patent is extended or adjusted under 35 U.S.C. 154(b) by 477 days.

(21) Appl. No.: 11/771,065

(22) Filed: Jun. 29, 2007

(65) Prior Publication Data

US 2008/0219044 A1    Sep. 11, 2008

Related U.S. Application Data

(60) Provisional application No. 60/893,229, filed on Mar. 6, 2007.

(51) Int. Cl.
*G11C 11/00* (2006.01)

(52) U.S. Cl. ...... 365/158; 365/148; 365/203; 365/210.1

(58) Field of Classification Search .......... 365/158, 365/203, 189.09, 230.07, 171, 209, 148
See application file for complete search history.

(56) References Cited

U.S. PATENT DOCUMENTS

| | | | |
|---|---|---|---|
| 6,614,681 B2 * | 9/2003 | Hidaka | 365/171 |
| 6,839,269 B2 * | 1/2005 | Iwata et al. | 365/158 |
| 6,999,366 B2 | 2/2006 | Perner et al. | |
| 7,016,220 B2 | 3/2006 | Lee et al. | |
| 7,394,684 B2 * | 7/2008 | Inokuchi et al. | 365/158 |
| 2005/0146926 A1 * | 7/2005 | Inaba | 365/171 |

FOREIGN PATENT DOCUMENTS

| | | |
|---|---|---|
| EP | 1560221 | 8/2005 |
| KR | 0518692 | 10/2005 |

OTHER PUBLICATIONS

Wang Frank Z: "Diode-Free Magnetic Random Access Memory Using Spin-Dependent Tunneling Effect" Applied Physics Letters, AIP, American Institute of Physics, Melville, NY, vol. 77, No. 13, Sep. 25, 2000, pp. 2036-2038.
International Search Report-PCT/US08/056090, International Search Authortiy-European Patent Office-Jul. 11, 2008.
Written Opinion-PCT/US08/056090, International Search Authority-European Patent Office-Jul. 11, 2008.
Translation of Office Action in Korean application 10-2009-7020232 corresponding to U.S. Appl. No. 11/771,065, citing KR0518692 dated Feb. 12, 2011.

* cited by examiner

*Primary Examiner* — Tuan T Nguyen
*Assistant Examiner* — Toan Le
(74) *Attorney, Agent, or Firm* — Semion Talpalatsky

(57) ABSTRACT

Systems, circuits and methods for reducing read disturbances in Spin Transfer Torque Magnetoresistive Random Access Memory (STT-MRAM) are disclosed. A resistive element can be used during the read operation to control the read current and control read disturbances. An isolation element can be used to isolate the resistive element from the circuit during write operations.

32 Claims, 5 Drawing Sheets

READ & WRITE

READ DISTURB REDUCTION CIRCUIT FOR SPIN TRANSFER TORQUE MAGNETORESISTIVE RANDOM ACCESS MEMORY

CLAIM OF PRIORITY UNDER 35 U.S.C. §119

The present Application for Patent claims priority to Provisional Application No. 60/893,229 entitled "READ DISTURB REDUCTION CIRCUIT FOR SPIN TRANSFER TORQUE MAGNETORESISTIVE RANDOM ACCESS MEMORY" filed Mar. 6, 2007, and assigned to the assignee hereof and hereby expressly incorporated by reference herein.

FIELD OF DISCLOSURE

Embodiments of the invention are related to random access memory (RAM). More particularly, embodiments of the invention are related to read current control in Spin Transfer Torque Magnetoresistive Random Access Memory (STT-MRAM).

BACKGROUND

Random access memory (RAM) is a ubiquitous component of modern digital architectures. RAM can be stand alone devices or can be integrated or embedded within devices that use the RAM, such as microprocessors, microcontrollers, application specific integrated circuits (ASICs), system-on-chip (SoC), and other like devices as will be appreciated by those skilled in the art. RAM can be volatile or non-volatile. Volatile RAM loses its stored information whenever power is removed. Non-volatile RAM can maintain its memory contents even when power is removed from the memory. Although non-volatile RAM has advantages in the ability to maintain its contents without having power applied, conventional non-volatile RAM has slower read/write times than volatile RAM.

Magnetoresistive Random Access Memory (MRAM) is a non-volatile memory technology that has response (read/write) times comparable to volatile memory. In contrast to conventional RAM technologies which store data as electric charges or current flows, MRAM uses magnetic elements. As illustrated in FIGS. 1A and 1B, a magnetic tunnel junction (MTJ) storage element 100 can be formed from two magnetic layers 110 and 130, each of which can hold a magnetic field, separated by an insulating (tunnel barrier) layer 120. One of the two layers (e.g., fixed layer 110), is set to a particular polarity. The other layer's (e.g., free layer 130) polarity 132 is free to change to match that of an external field that can be applied. A change in the polarity 132 of the free layer 130 will change the resistance of the MTJ storage element 100. For example, when the polarities are aligned, FIG. 1A, a low resistance state exists. When the polarities are not aligned, FIG. 1B, then a high resistance state exists. The illustration of MTJ 100 has been simplified for illustration and those skilled in the art will appreciate that each layer illustrated may comprise one or more layers of materials.

Referring to FIG. 2A, a memory cell 200 of a conventional MRAM is illustrated for a read operation. The cell 200 includes a transistor 210, bit line 220, digit line 230 and word line 240. The cell 200 can be read by measuring the electrical resistance of the MTJ 100. For example, a particular MTJ 100 can be selected by activating an associated transistor 210, which can switch current from a bit line 220 through the MTJ 100. Due to the tunnel magnetoresistance effect, the electrical resistance of the MTJ 100 changes based on the orientation of the polarities in the two magnetic layers (e.g., 110, 130), as discussed above. The resistance inside any particular MTJ 100 can be determined from the current, resulting from the polarity of the free layer. Conventionally, if the fixed layer 110 and free layer 130 have the same polarity, the resistance is low and a "0" is read. If the fixed layer 110 and free layer 130 have opposite polarity, the resistance is higher and a "1" is read.

Referring to FIG. 2B, the memory cell 200 of a conventional MRAM is illustrated for a write operation. The write operation of the MRAM is a magnetic operation. Accordingly, transistor 210 is off during the write operation. Current is propagated through the bit line 220 and digit line 230 to establish magnetic fields 250 and 260 that can affect the polarity of the free layer of the MTJ 100 and consequently the logic state of the cell 200. Accordingly, data can be written to and stored in the MTJ 100.

MRAM has several desirable characteristics that make it a candidate for a universal memory, such as high speed, high density (i.e., small bitcell size), low power consumption, and no degradation over time. However, MRAM has scalability issues. Specifically, as the bit cells become smaller, the magnetic fields used for switching the memory state increase. Accordingly, current density and power consumption increase to provide the higher magnetic fields, thus limiting the scalability of the MRAM.

Unlike conventional MRAM, Spin Transfer Torque Magnetoresistive Random Access Memory (STT-MRAM) uses electrons that become spin-polarized as the electrons pass through a thin film (spin filter). STT-MRAM is also known as Spin Transfer Torque RAM (STT-RAM), Spin Torque Transfer Magnetization Switching RAM (Spin-RAM), and Spin Momentum Transfer RAM (SMT-RAM). During the write operation, the spin-polarized electrons exert a torque on the free layer, which can switch the polarity of the free layer. The read operation is similar to conventional MRAM in that a current is used to detect the resistance/logic state of the MTJ storage element, as discussed in the foregoing. As illustrated in FIG. 3A, a STT-MRAM bit cell 300 includes MTJ 305, transistor 310, bit line 320 and word line 330. The transistor 310 is switched on for both read and write operations to allow current to flow through the MTJ 305, so that the logic state can be read or written.

Referring to FIG. 3B, a more detailed diagram of a STT-MRAM cell 301 is illustrated, for further discussion of the read/write operations. In addition to the previously discussed elements such as MTJ 305, transistor 310, bit line 320 and word line 330, a source line 340, sense amplifier 350, read/write circuitry 360 and bit line reference 370 are illustrated. As discussed above, the write operation in an STT-MRAM is electrical. Read/write circuitry 360 generates a write voltage between the bit line 320 and the source line 340. Depending on the polarity of the voltage between bit line 320 and source line 340, the polarity of the free layer of the MTJ 305 can be changed and correspondingly the logic state can be written to the cell 301. Likewise, during a read operation, a read current is generated, which flows between the bit line 320 and source line 340 through MTJ 305. When the current is permitted to flow via transistor 310, the resistance (logic state) of the MTJ 305 can be determined based on the voltage differential between the bit line 320 and source line 340, which is compared to a reference 370 and then amplified by sense amplifier 350. Those skilled in the art will appreciate the operation and construction of the memory cell 301 is known in the art. Additional details are provided, for example, in M. Hosomi, et al., A Novel Nonvolatile Memory with Spin Transfer Torque Magnetization Switching: Spin-RAM, proceedings of IEDM conference (2005), which is incorporated herein by reference in its entirety.

The electrical write operation of STT-MRAM eliminates the scaling problem due to the magnetic write operation in MRAM. Further, the circuit design is less complicated for STT-MRAM. However, because both read and write operations are performed by passing current through the MTJ 305, there is a potential for read operations to degrade the data stored in the MTJ 305. For example, if the read current is similar or greater in magnitude than the write current threshold, then there is a substantial chance the read operation may disturb the logic state of MTJ 305 and thus degrade the integrity of the memory.

SUMMARY

Exemplary embodiments of the invention are directed to systems, circuits and methods for reducing read disturbances in STT-MRAM.

Accordingly an embodiment of the invention can include a Spin Transfer Torque Magnetoresistive Random Access Memory (STT-MRAM) comprising a bit cell coupled to a bit line and a source line, and a resistive element interposed between the bit cell and a sense amplifier in the bit line.

Another embodiment of the invention can include a method for preventing read disturbances in a Spin Transfer Torque Magnetoresistive Random Access Memory (STT-MRAM) comprising coupling a resistive element between a bit cell and a sense amplifier during a read operation, and decoupling the resistive element during a write operation.

BRIEF DESCRIPTION OF THE DRAWINGS

The accompanying drawings are presented to aid in the description of embodiments of the invention and are provided solely for illustration of the embodiments and not limitation thereof.

DETAILED DESCRIPTION

Aspects of embodiments of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

As discussed in the background, STT-MRAM uses a low write current for each cell, which is an advantage of this memory type over MRAM. However, cell read current can approach or be higher than a write current threshold and thus cause an invalid write operation to happen. To control the read disturb of the memory cell, embodiments of the invention include a resistive element during the read operation. The read current can be controlled through the resistive element to a range where a probability of an invalid write/read disturb is minimized. The resistive element can be selectively used for the read operation and bypassed for write operation. The resistive element can be any element that has a resistance such as a poly, active, well and/or transistor device.

Figure 1A:
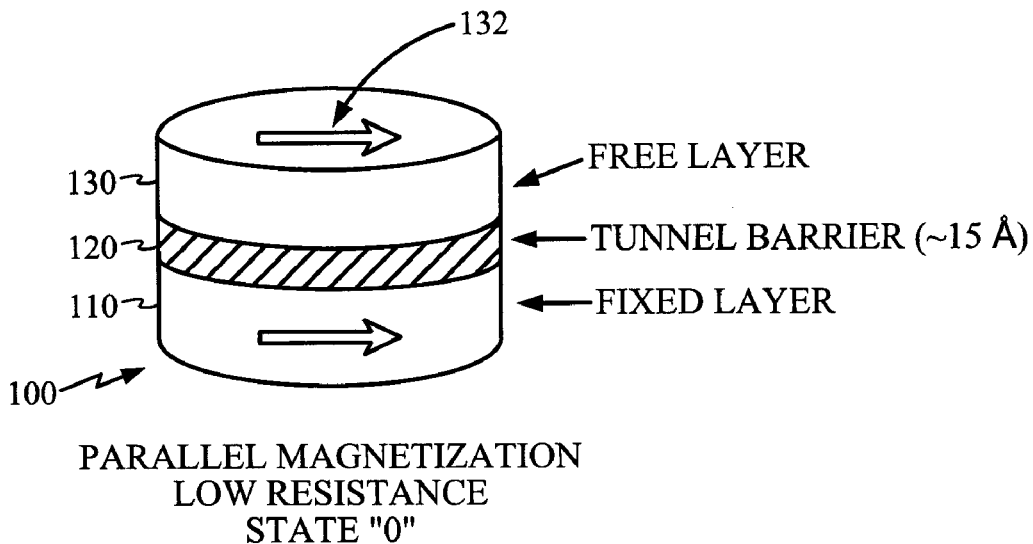
FIGS. 1A and 1B are illustrations of a magnetic tunnel junction (MTJ) storage element.
Figure 1B:
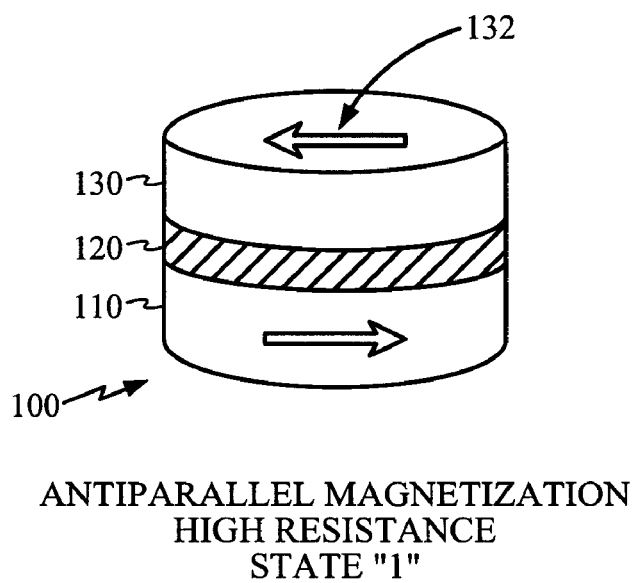
Figure 2A:
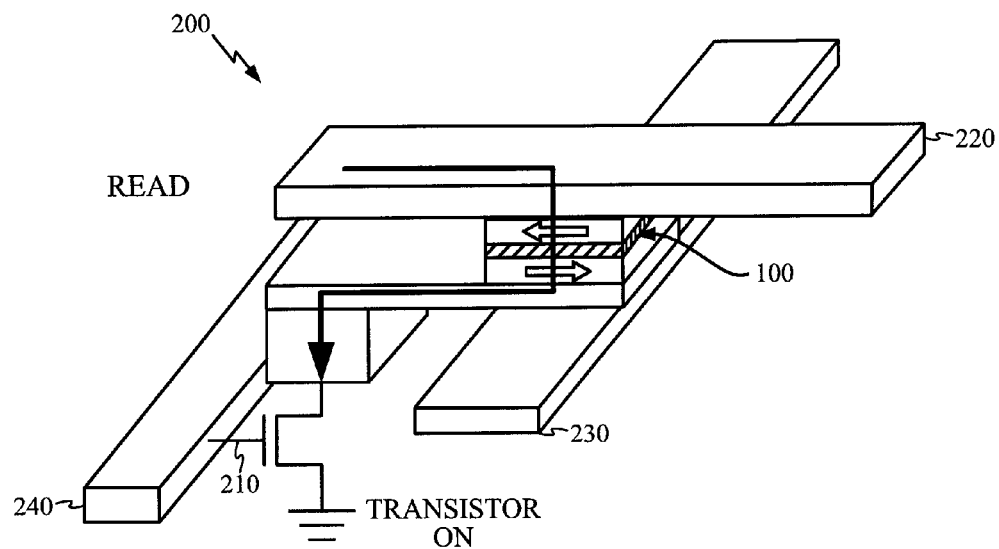
FIGS. 2A and 2B are illustrations of a Magnetoresistive Random Access Memory (MRAM) cell during read and write operations, respectively.
Figure 2B:
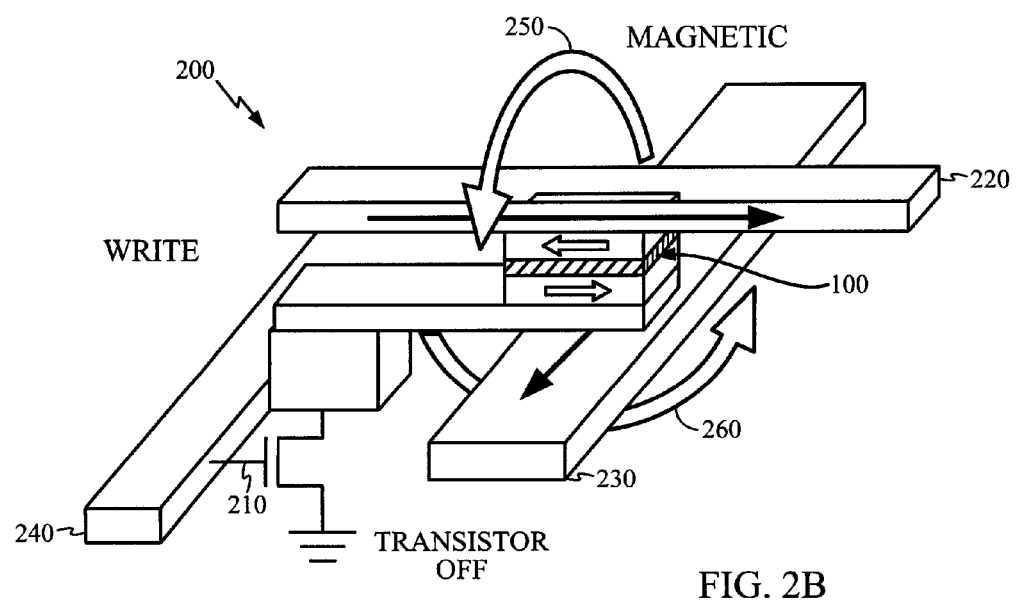
Figure 3A:
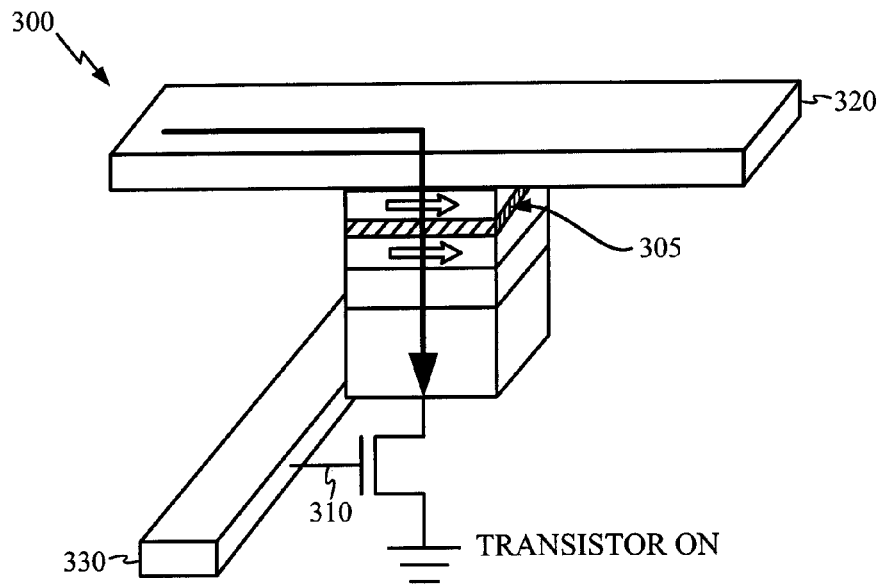
FIGS. 3A and 3B are illustrations of Spin Transfer Torque Magnetoresistive Random Access Memory (STT-MRAM) cells.
Figure 3B:
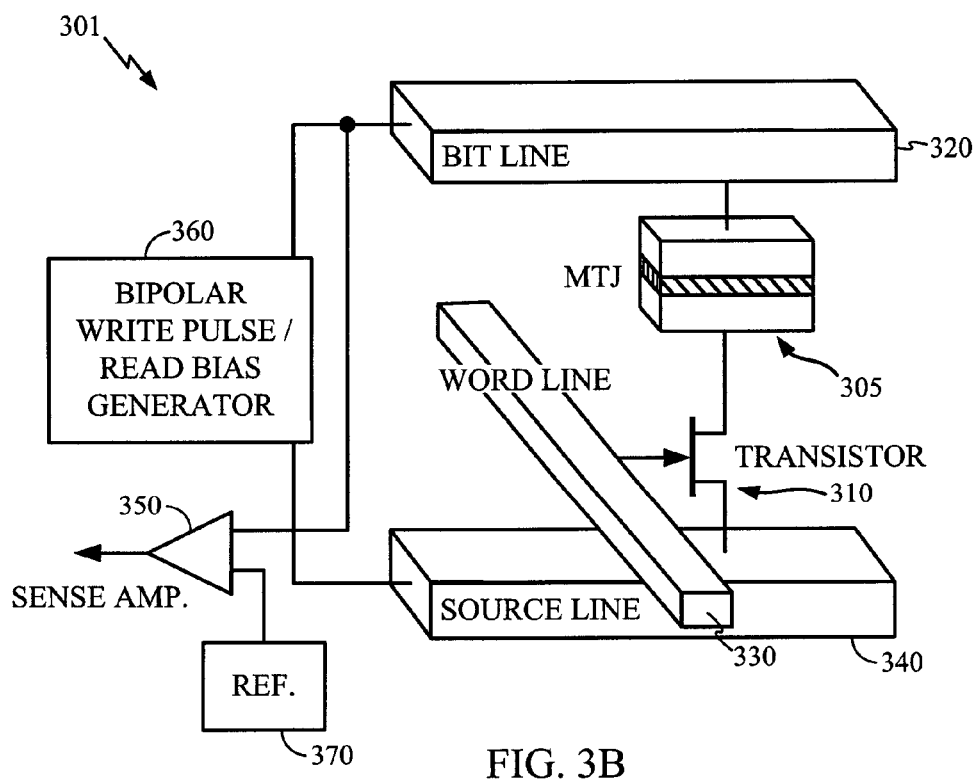
Figure 4A:
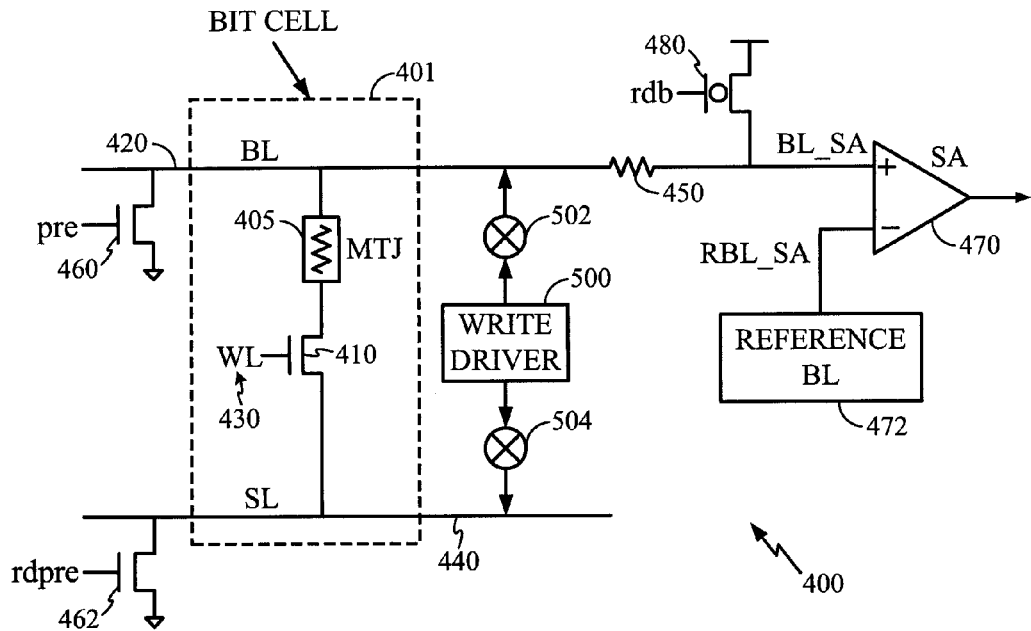
FIGS. 4A and 4B are illustrations of circuit configurations for reduced read disturbances in a STT-MRAM.

FIG. 4A illustrates a circuit configuration 400 for reduced read disturbances in a STT-MRAM. The circuit includes a bit cell 401 such as discussed in the foregoing disclosure including MTJ 405 and transistor 410 coupled between bit line 420 and source line 440. Further, the transistor 410 is coupled to word line 430, as discussed above. A resistance element 450 is coupled to the bit line 420 to control the read current and prevent read disturbance of the MTJ 405. As discussed above, the resistive element can be any device or combination of devices that has a resistance such as a poly, active, well and/or transistor device. The resistive element can be sized in proportion to the value of the MTJ. As noted above, the MTJ will have two resistive values for state "0" and state "1". Accordingly, the resistance can be based on the maximum resistance, minimum resistance or average resistance, as long as the resistive element is sized to reduce the potential for read disturbances. For example, assume the MTJ has a resistances of 2KΩ to 4KΩ, the value of the resistance could be established in the range of 1KΩ to 10KΩ or 0.25 to 5.0 times the MTJ resistances. Once again, the foregoing is merely an example and it will be appreciated that the resistive value will be based on the resistive values of the MTJ and in consideration with other aspects of the circuit, such as strength of transistor 480, sense amplifier design, and the like which can impact the read disturbance/performance of the bitcell. Accordingly, those skilled in the art will appreciate that the circuit configuration illustrated herein is merely to facilitate a description of aspects of embodiments of the invention and is not intended to limit the embodiments to the illustrated elements and/or arrangements.

Figure 4B:
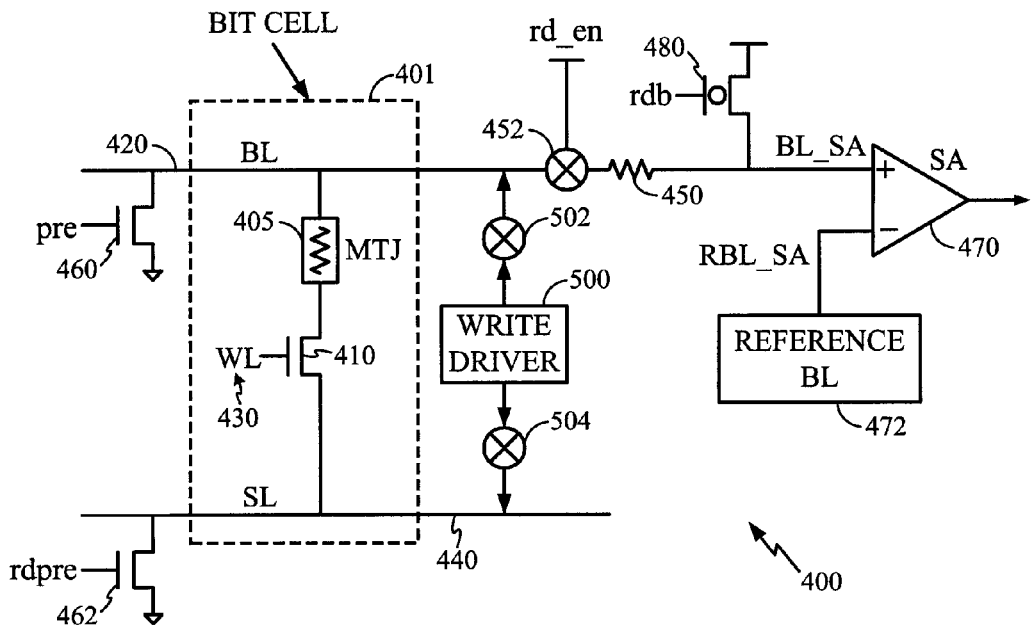

FIG. 4B illustrates an alternative embodiment in which circuit configuration 400 further includes an isolation element 452 and related signaling. The circuit includes a bit cell 401 such as discussed in the foregoing disclosure including MTJ 405 and transistor 410 coupled between bit line 420 and source line 440. Further, the transistor 410 is coupled to word line 430, as discussed above. A resistance element 450 and related isolation element 452 are coupled to the bit line 420 to control the read current and prevent read disturbance of the MTJ 405. As discussed above, the resistive element can be any device or combination of devices that has a resistance such as a poly, active, well and/or transistor device. Likewise, the isolation element 452 can be any device or combination of devices that can cause the resistive element 450 to affect read current during the read operations and to isolate the resistive element 450 during the write operations. For example, the isolation element 452 can be a transmission gate coupled in series with the resistive element. However, those skilled in the art will appreciate that other devices and/or combinations of devices such as multiplexers and the like may be used. Further, the resistive element 450 and/or isolation element 452 may be arranged in alternate configurations to achieve the same functionality. For example, a switching device may be coupled in parallel with resistive element 450 to effectively bypass the resistive element 450. Additionally, another switching device could be coupled in series with the resistive element 450 to provide additional isolation of the resistive element 450. Accordingly, those skilled in the art will appreciate that the circuit configuration illustrated herein is merely to facilitate a description of aspects of embodiments of the invention and is not intended to limit the embodiments to the illustrated elements and/or arrangements.

Referring back to FIG. 4B, the isolation element 452 can receive a read enable signal (rd_en) to coordinate the switching of the resistive element 450 with the read operation. A pre-charge (pre) can be received by a pre-charge transistor 460 coupled to the bit line 420. Conventionally, there is one pre-charge transistor 460 per bit line 420. The pre-charge transistor 460 can be used for both read and write operations. A read pre-charge signal (rdpre) can be received by read pre-charge transistor 462 coupled to the source line 440. Another read signal (rdb) can be received by a read pre-charge transistor 480 couple to the bit line. Transistor 480 is configured to couple a source (e.g., supply voltage) to the bit line for the read operation. A sense amplifier 470 is coupled to the bit line and to a reference 472 and can be used to determine the state of the bit cell 401 by amplifying the voltage differential or current differential between the BL_SA and RBL_SA lines during the read operation. The reference bit line RBL_SA can also have a reference resistive element (not shown) corresponding to resistance 450 in the bit line BL_SA. Additional discussion of the signals and circuit operation follow in the description of FIG. 6.

Accordingly, an embodiment of the invention can include a Spin Transfer Torque Magnetoresistive Random Access Memory (STT-MRAM) comprising a bit cell 401 coupled to bit line 420 and a source line 440 and a resistive element 450 interposed between the bit cell 401 and a sense amplifier 470. Embodiments can further include an isolation element 452 couple to the resistive element 450. The isolation element 452 is configured to selectively couple the resistive element 450 from in the bit line 420 during a read operation and can also be configured to isolate the resistive element 450 during the write operation.

Figure 5:
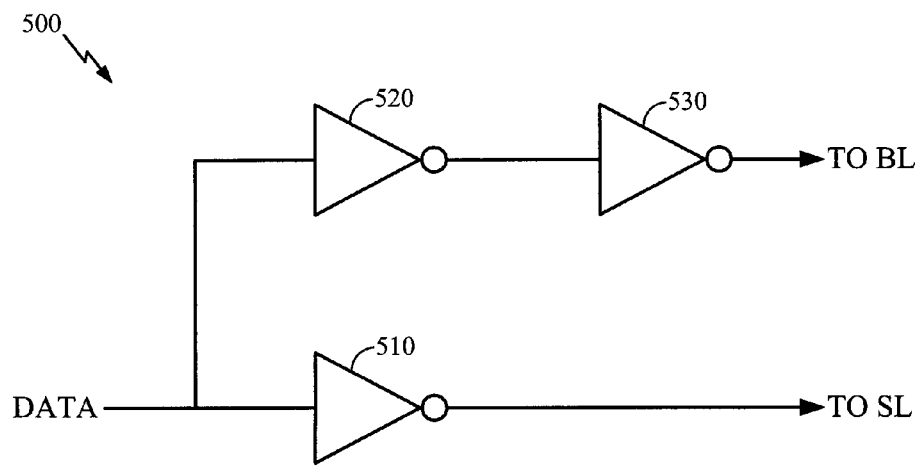
FIG. 5 is an illustration of a circuit configuration for a write driver for a STT-MRAM.

A write driver 500 and related write isolation elements 502 and 504 are coupled between the bit line 420 and source line 440 to enable writing data to bit cell 401. As discussed above, in a STT-MRAM passing current through the MTJ 405 can change the polarity of the free layer which in turn changes the resistance of the MTJ 405 and which can then be detected as a change of logic state of the bit cell 401. The write isolation elements 502 and 504 can be any device or combination of devices that can selectively couple and decouple the write driver 500. For example, the write isolation elements 502 and 504 can be transmission gates coupled in series with the write driver 500. Further, the write isolation elements can receive a write enable signal (not shown) to coordinate coupling the write driver 500 during the write operation. However, those skilled in the art will appreciate that the write isolation elements 502 and 504 can be other devices and/or combinations of devices such as multiplexers and the like, which can be used to achieve the same functionality. Referring to FIG. 5, a circuit configuration for write line driver 500 is illustrated. The write line driver 500 can include a plurality of inverters 510, 520 and 530 configured to differentially drive the bit line (BL) and source line (SL) based on a received data input that is to be written to the bit cell. The write operation is known in the art and details will not be discussed further herein.

Accordingly, embodiments of the invention can include the STT-MRAM device discussed above further including a write driver 500 configured to provide an electrical signal to the bit cell 401 to store a logic state in the bit cell 401. At least one write isolation element (e.g., 502, 504) is coupled in series with the write driver 500 between the bit line 420 and source line 440. The write driver can include first 520 and second 530 inverters coupled in series between a data input and the bit line 520 and a third inverter 510 coupled in series between the data input and the source line 440.

Figure 6:
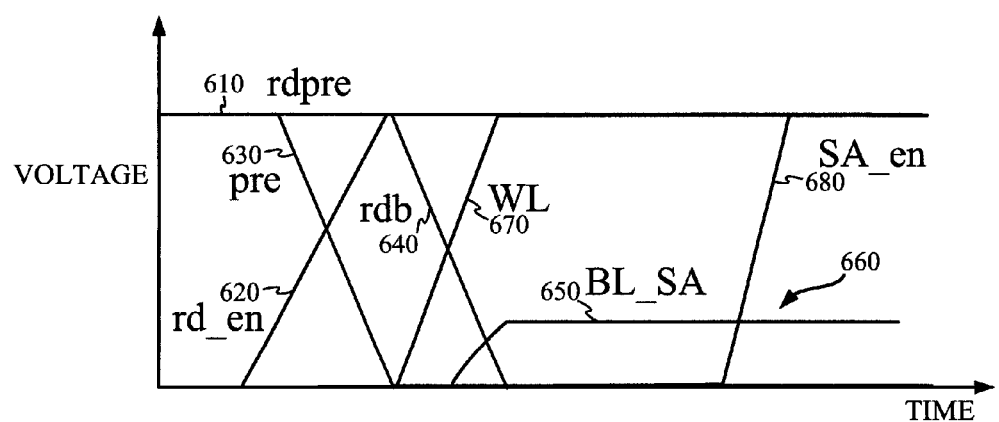
FIG. 6 is a graph illustrating various signal line states during a read operation of a STT-MRAM.

A graph illustrating various signal line states during a read operation of STT-MRAM bit cell 401 is provided in FIG. 6. During the read operation, the source line read pre-charge signal (rdpre) 610 provided to transistor 462 is at a high state. Accordingly, the source line will be discharged. The read enable (rd_en) signal 620 provided to isolation element 452 switches from a low state to a high state and isolation element 452 switches from a blocking state to a conducting state. For example, in one embodiment, the read enable (rd_en) signal 620 controls the NMOS transistor in a transmission gate (e.g., isolation element 452) which is activated when read enable (rd_en) signal 620 is in a high state. Bit line pre-charge signal (pre) 630 provided to transistor 460 transitions from a high to low state to allow the bit line to charge. The bit line read pre-charge signal (rdb) 640 transitions from a high state to a low state. Since rdb 640 is provided to a P-MOS transistor, transistor 480 turns on and provides current for the read operation. Transistor 480 can be designed to have a drop across the transistor 480 even in the on state. Accordingly, the voltage/current of the bit line will vary based on the resistive element and resistive value of the MTJ and will settle a specific value (e.g., 650).

Following, the settling of the foregoing signal transitions, a voltage 650 on the bit line can be established that corresponds to the logic state stored in bit cell 401. For example, WL 670 transitions from low to high, which activates word line transistor 410 to select the bit cell 401 to be read. Although only one bit cell is illustrated, it will be appreciated that a plurality of bit cells can be coupled to a common bit line, as is known in the art. Further, the bit cells and circuits can be arranged to form memory arrays, as is known in the art. Upon settling of the bit line voltage 650 (BL_SA) at the sense amp, the value can be read (e.g., at time 660) by the sense amplifier 470 in response to the sense amp enable signal 680 (SA_en), as is known in the art. Since the resistive element will be in the read circuit during the read operation, signal 620 (rd_en) can activate isolation element 452, if provided. As discussed above, the current during the read operation can be controlled via resistive element 450 and will not produce a read disturbance to the logic state of MTJ 405. Further, the resistive element can be sized in accordance with the resistive states of the MTJ 405, which can vary based on the materials and physical size of the MTJ 405.

Although the foregoing discusses specific voltage level, transitions, logic states, and the like, it will be appreciated that these were provided merely for illustrative purposes and embodiments of the invention are not limited to these examples. For example, to turn on an NMOS transistor a high voltage/logic state needs to be provided to its gate. However, a low voltage/logic level is provided to the gate of a PMOS transistor to turn it on. Accordingly, the signals may be inverted to achieve the same functional operation. Accordingly, the functionalities described herein may be accomplished using different signaling, devices, and arrangements. However, each of these variations that achieve the functionalities described herein are included in embodiments of the invention.

In view of the foregoing, it will be appreciated that embodiments of the invention include methods for performing the sequence of actions, functions, steps and/or algorithms disclosed herein. Accordingly an embodiment of the invention can include a method for preventing read disturbances in a Spin Transfer Torque Magnetoresistive Random Access Memory (STT-MRAM) device. The method can include coupling a resistive element between a bit cell and a sense amplifier during a read operation and decoupling the resistive element during a write operation. The method can further include discharging the bit line prior to reading the bit line (e.g., 630), charging the bit line before reading the bit line (e.g., 640), reading the bit line after the charge has stabilized (e.g., 660), and discharging the source line prior to and while reading the bit line (e.g., 610).

While the foregoing disclosure shows illustrative embodiments of the invention, it should be noted that various changes and modifications could be made herein without departing from the scope of the invention as defined by the appended claims. The functions, steps and/or actions of the methods in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A Spin Transfer Torque Magnetoresistive Random Access Memory (STT-MRAM) comprising:
   a bit cell coupled to a bit line and a source line; and
   a resistive element interposed between the bit cell and a sense amplifier in the bit line, wherein the resistive element is configured to create a passive voltage drop between the bit cell and the sense amplifier.

2. The STT-MRAM claim 1, further comprising:
   an isolation element couple to the resistive element and interposed between the bit cell and the sense amplifier, wherein the isolation element is configured to selectively couple the resistive element to the bit line during a read operation.

3. The STT-MRAM of claim 2, wherein the isolation element and resistive element are coupled in series in the bit line.

4. The STT-MRAM of claim 2, wherein the isolation element is at least one of a transistor, switch, a transmission gate, or a multiplexer.

5. The STT-MRAM of claim 2, wherein the resistive element is a discrete element coupled in series with the isolation element.

6. The STT-MRAM of claim 1, wherein the resistive element is at least one of a poly, a well or a transistor device.

7. The STT-MRAM of claim 1, wherein the bit cell comprises:
   a magnetic tunnel junction (MTJ); and
   a word line transistor coupled in series with the MTJ.

8. STT-MRAM of claim 7, wherein a resistance value of the resistive device is the range of 0.25 to 5.0 times the MTJ resistance.

9. The STT-MRAM of claim 1, further comprising:
   a first pre-charge transistor coupled to the resistive element, wherein the first pre-charge transistor is configured to provide a positive voltage to the bit line during a read operation.

10. The STT-MRAM of claim 1, further comprising:
    a reference source; and
    a reference resistive element coupled between the reference source and the sense amplifier.

11. The STT-MRAM of claim 1, further comprising:
    a plurality of bit cells coupled to the bit line and the source line, wherein the resistive element is interposed between the plurality of bit cells and the sense amplifier in the bit line.

12. The STT-MRAM of claim 1, wherein the resistive element is a discrete element coupled in parallel with switching device to bypass the resistive element.

13. The STT-MRAM of claim 1, wherein a resistance value of the resistive device is the range of 1KΩ to 10KΩ.

14. A Spin Transfer Torque Magnetoresistive Random Access Memory (STT-MRAM) comprising:
    a bit cell coupled to a bit line and a source line;
    a resistive element interposed between the bit cell and a sense amplifier in the bit line
    a first pre-charge transistor coupled to the resistive element, wherein the first pre-charge transistor is configured to provide a positive voltage to the bit line during a read operation
    a second pre-charge transistor couple to the bit line; and
    a third pre-charge transistor coupled to the source line.

15. The STT-MRAM of claim 14, wherein the second pre-charge transistor is configured to discharge the bit line prior to the read operation and the third pre-charge transistor is configured to discharge the source line.

16. A Spin Transfer Torque Magnetoresistive Random Access Memory (STT-MRAM) comprising:
    a bit cell coupled to a bit line and a source line;
    a resistive element interposed between the bit cell and a sense amplifier in the bit line
    a write driver configured to store a logic state in the bit cell; and
    two write isolation elements coupled in series with the write driver between the bit line and source line, wherein the write isolation elements are configured to couple the write driver to the bit line and source line during a write operation.

17. The STT-MRAM of claim 16, wherein the write driver is configured to differentially drive the bit line and source line.

18. The STT-MRAM of claim 17, wherein the write driver comprises:
    first and second inverters coupled in series between a data input and the bit line; and
    a third inverter coupled in series between the data input and the source line.

19. A method for preventing read disturbances in a Spin Transfer Torque Magnetoresistive Random Access Memory (STT-MRAM) comprising:
    coupling a resistive element between a bit cell and a sense amplifier during a read operation; and
    decoupling the resistive element during a write operation, wherein the resistive element is configured to create a passive voltage drop between the bit cell and the sense amplifier.

20. The method of claim 19, wherein the bit cell is coupled to a bit line and source line and the resistive element is in series in the bit line.

21. The method of claim 20, further comprising:
    charging the bit line before reading the bit line;
    reading the bit line after the charge has stabilized; and
    discharging the source line before reading the bit line.

22. The method of claim 19, further comprising:
    generating a read enable signal that controls the coupling and decoupling of the resistive element.

23. The method of claim 22, wherein an isolation element receives the read enable signal and is configured to couple the resistive element during a read operation and decouple the resistive element during a write operation.

24. The method of claim 19, wherein the bit cell comprises:
a magnetic tunnel junction (MTJ); and
a word line transistor coupled in series with the MTJ.

25. The method of claim 19, further comprising:
generating a bit line reference source;
determining a logic state of the bit cell based upon the difference between the bit line and the reference source at the sense amplifier, wherein a reference resistive element is coupled between the reference source and the sense amplifier.

26. A Spin Transfer Torque Magnetoresistive Random Access Memory (STT-MRAM) comprising:
means for coupling a resistive element between a bit cell and a sense amplifier during a read operation; and
means for decoupling the resistive element during a write operation, wherein the resistive element is configured to create a passive voltage drop between the hit cell and the sense amplifier.

27. The STT-MRAM of claim 26, wherein the bit cell is coupled to a bit line and source line and the resistive element is in series in the bit line.

28. The STT-MRAM of claim 27, further comprising:
means for charging the bit line before reading the bit line;
means for reading the bit line after the charge has stabilized; and
means for discharging the source line before reading the bit line.

29. The STT-MRAM of claim 26, further comprising:
means for generating a read enable signal that controls the coupling and decoupling of the resistive element.

30. The STT-MRAM of claim 29, wherein an isolation element receives the read enable signal and is configured to couple the resistive element during a read operation and decouple the resistive element during a write operation.

31. The STT-MRAM of claim 26, wherein the bit cell comprises:
a magnetic tunnel junction (MTJ); and
a word line transistor coupled in series with the MTJ.

32. The STT-MRAM of claim 26, further comprising:
means for generating a bit line reference source;
means for determining a logic state of the bit cell based upon the difference between the bit line and the reference source at the sense amplifier, wherein a reference resistive element is coupled between the means for generating the reference source and the sense amplifier.

* * * * *